United States Patent [19]

Davis et al.

[11] 4,345,163
[45] Aug. 17, 1982

[54] CONTROL CIRCUITRY FOR HIGH VOLTAGE SOLID-STATE SWITCHES

[75] Inventors: James A. Davis, Glen Ellyn; William F. MacPherson, Winfield Township, DuPage County; Harry E. Mussman, Glen Ellyn, all of Ill.; Peter W. Shackle, Bridgewater, N.J.

[73] Assignee: Bell Telephone Laboratories, Incorporated, Murray Hill, N.J.

[21] Appl. No.: 150,184

[22] Filed: May 15, 1980

[51] Int. Cl.$^3$ ............................................. H03K 17/60
[52] U.S. Cl. ............................... 307/252 A; 307/252 C; 307/305; 307/318; 307/566; 357/38
[58] Field of Search ............... 307/252 A, 252 C, 237, 307/305, 318; 357/38

[56] References Cited

U.S. PATENT DOCUMENTS 4,250,409  2/1981  Davis et al. ..................... 307/252 A Primary Examiner—Joseph E. Clawson, Jr.
Attorney, Agent, or Firm—Irwin Ostroff

[57] ABSTRACT

To switch a first gated diode switch (GDS1) to the "OFF" state requires a voltage applied to the gate which is more positive than that of the anode or cathode and a sourcing of current into the gate of substantially the same order of magnitude as flows between the anode and cathode of the first switch. Control circuitry, which uses a second gated diode switch (GDSC) coupled by the cathode to the gate of the first switch (GDS1), is used to control the state of the first switch (GDS1). The control circuitry comprises a first branch circuit coupled to the gate of GDSC and to a first potential source +V1, a second branch circuit coupled to the anode of GDSC and to a second potential source +V2, and a third branch circuit coupled to the anode of GDSC and to a third potential source +V3. The first branch circuit is connected to the gate of the second switch (GDSC) and controls the state thereof. The second branch circuit maintains the state of the load switch (GDS1) and is adapted to supply up to a preselected maximum amount of current into the anode of GDSC and then to automatically reduce the amount of supplied current substantially. The third branch circuit is used to provide a surge of current during a current break operation to turn GDS1 to an OFF state.

3 Claims, 3 Drawing Figures

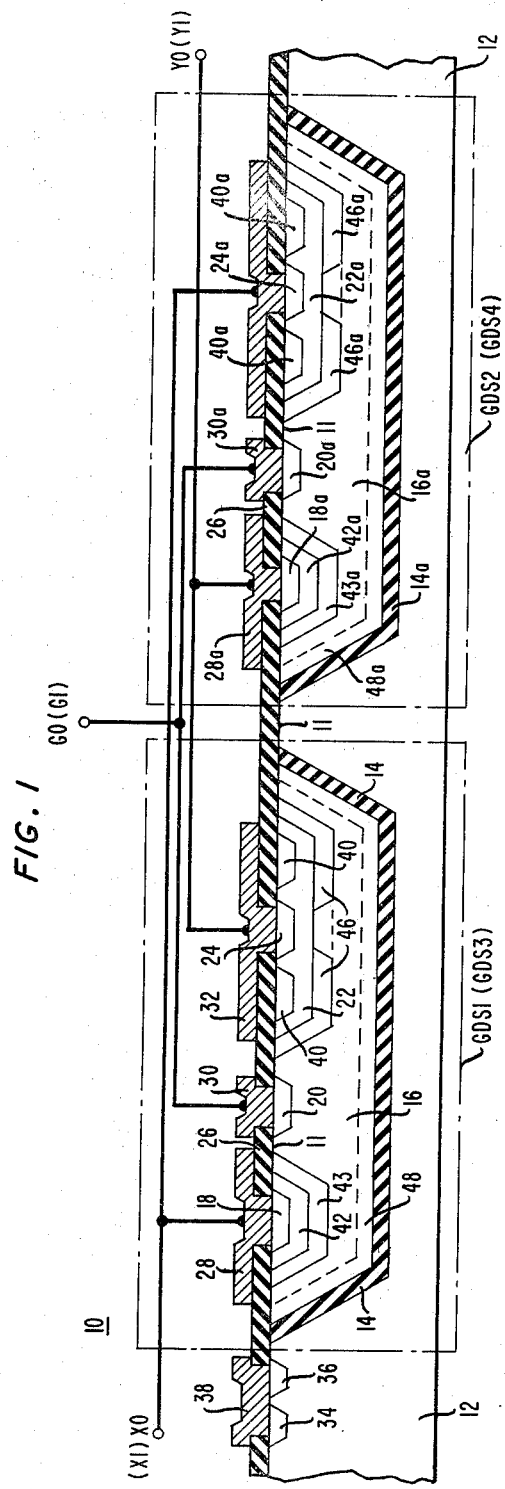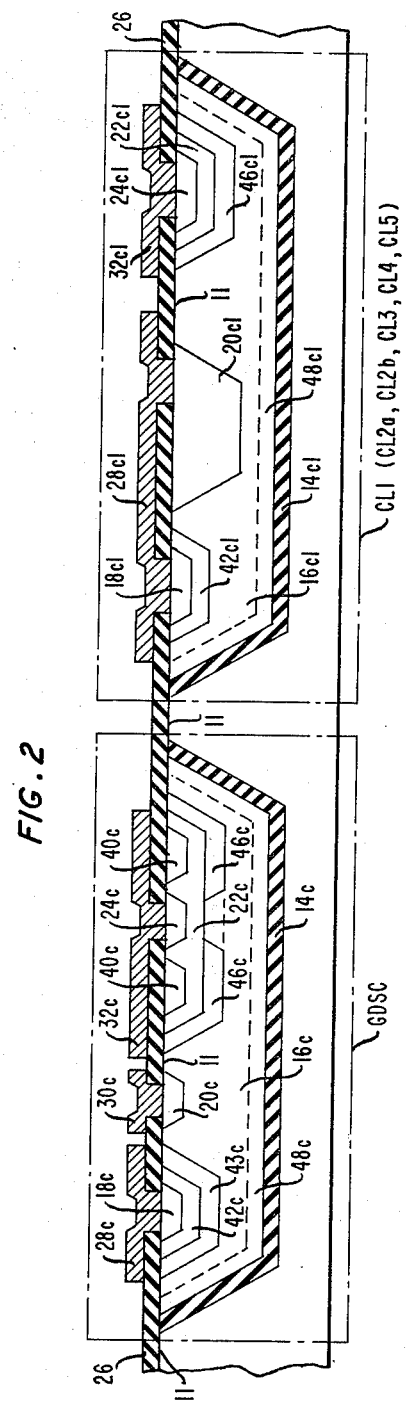

CONTROL CIRCUITRY FOR HIGH VOLTAGE SOLID-STATE SWITCHES

TECHNICAL FIELD

This invention relates to control circuitry for controlling the state of solid-state switches and, in particular, to control circuitry for controlling the state of solid-state switches which have high voltage and relatively high current capabilities.

BACKGROUND OF THE INVENTION

High voltage and relatively high current capability solid-state switches, such as those described in the articles entitled "A Field Terminated Diode" by Douglas E. Houston et al, published in IEEE Transactions on Electron Devices, Vol. ED-23, No. 8, August, 1976, pages 905–911, and "A 500 V Monolithic Bidirectional 2×2 Crosspoint Array" by P. W. Shackle et al., published in 1980 IEEE International Solid-State Circuits Conference Digest of Technical Papers, Vol. 23, February, 1980, pages 170–171, and those discussed in U.S. patent applications Ser. Nos. 972,056 abandoned (A. R. Hartman-T. J. Riley-P. W. Shackle), 972,021 abandoned (A. R. Hartman-A. U. Mac Rae-P. W. Shackle), 972,022 abandoned (J. E. Berthold-A. R. Hartman-T. J. Riley-P. W. Shackle), and 971,886 abandoned (A. R. Hartman-B. T. Murphy-T. J. Riley-P. W. Shackle), all filed Dec. 20, 1978, and having a common assignee with the present application, and U.S. patent applications Ser. Nos. 107,774 (A. R. Hartman-T. J. Riley-P. W. Shackle), 107,773 (A. R. Hartman-B. T. Murphy-T. J. Riley-P. W. Shackle), 107,772 (A. R. Hartman-A. U. Mac Rae-P. W. Shackle), 107,780 (J. E. Berthold-A. R. Hartman-T. J. Riley-P. W. Shackle), and 107,775 (A. R. Hartman-T. J. Riley-P. W. Shackle), which were filed Dec. 28, 1979, and which have a common assignee with the present application, have an ON (conducting) state and an OFF (blocking) state. These switches are capable of blocking relatively large potential differences in the OFF state. Each of these switches has two output terminals which are generally denoted as the anode and cathode, a control terminal which is generally denoted as the gate, and a semiconductor body whose bulk separates the anode, cathode, and gate regions. The parameters of the various portions of the semiconductor bodies of the structures of the above-discussed patent applications are such that with the potential of the anode region being greater than that of the cathode region and the potential of the gate region being insufficient to cause the potential of a vertical cross-sectional portion of the bulk of the semiconductor body between the anode and cathode to be greater in potential than the anode or cathode regions, there is facilitated a substantial current flow between the anode and cathode regions via the bulk. With the potential of the gate region being sufficiently more positive than that of the anode and cathode regions to cause a vertical cross-sectional portion of the bulk of the semiconductor body between the anode and cathode regions to be more positive in potential than the anode and cathode regions, there is facilitated an interrupting or inhibiting of current flow between the anode and cathode regions. The magnitude of the needed gate potential necessary to turn off these switches is a function of the gometry and doping levels of the semiconductor regions of each switch and of the anode and cathode potentials.

Control circuitry used to apply a blocking voltage to the gate terminal of each of these switches must be able to sustain a more positive voltage than is at the anode and cathode terminals and must be able to supply current which is generally of the same magnitude as flows through the anode and cathode of each switch.

U.S. patent applications Ser. Nos. 972,023 (A. R. Hartman-T. J. Riley-P. W. Shackle) and 972,024 (P. W. Shackle), which were both filed Dec. 20, 1978, and have a common assignee with the present application, describe and illustrate control circuitry which itself uses a high voltage and current switch of the type described hereinabove to control the state of a similar switch. If a control circuit should fail to break (interrupt) current flow through an ON switch connected thereto, it is necessary to electrically disconnect the control circuitry from one of the potential sources (power supplies). The control circuitry is then sequentially reset and reconnected to the potential source. It is then reactivated and a second attempt is made to break conduction through the ON switch.

Usually a conventional high voltage and high current capability switch is used between the high voltage source and the control circuitry. This switch can be an optically activated switch. Generally it is a relatively expensive component and only one is used for a relatively large number of control circuits. If any of the switches to be controlled fails to turn off, it is necessary to disconnect all the control circuits from the potential source (power supply). This may result in all of the switches connected to the control circuitries being switched to the ON state independent of which state is desired. This is undesirable in some switching applications.

It is desirable to have circuitry capable of controlling high voltage and high current solid-state switches of the type discussed hereinabove which can maintain some switches connected thereto in the desired state even if one of the switches being controlled fails to break current (to assume the OFF state). U.S. patent applications Ser. Nos. 107,777 and 107,778 (J. A. Davis-W. F. MacPherson-H. E. Mussman-P. W. Shackle and J. A. Davis-W. F. MacPherson-P. W. Shackle), both filed Dec. 28, 1979, which both have a common assignee and some common inventorship with the present application, disclose circuitry which has the desired characteristic and is an alternate to the circuitry of the present application. The present application has priority over the aforementioned applications.

SUMMARY OF THE INVENTION

The present invention is directed to control circuitry for controlling the state of high voltage and relatively high current load solid-state switch(es) (GDS1) of the type described hereinabove. The control circuitry essentially comprises a control switch (GDSC), which in a preferred embodiment is a gated diode switch, a first branch circuit (310A) coupled to the gate of GDSC and to a first potential source (+V1), a second branch circuit (310B) coupled to the anode of GDSC and to a second potential source (+V2), and a third branch circuit (310C) coupled to the anode of GDSC and to a third potential source (+V3).

The control switch (GDSC) is coupled by an output terminal 330 (typically the cathode) to the gate terminal (G0) of a load switch (GDS1) whose state is to be controlled. The load switch (GDS1) is also typically a gated diode switch. The first branch circuit (310A)

typically comprises an n-p-n transistor (T1), three p-n diodes (D1, D2, D3), and two current limiter circuits (CL1, CL3) which are typically pinch resistors. The second branch circuit (310B) typically comprises four p-n-p transistors (T2, T3, T4, and T5), one zener diode (Z1), and two current limiter circuits (CL4, CL5) which are typically pinch resistors. The third circuit branch (310C) comprises a high voltage and high current capability switch (T6, T7, T8, T9), two resistors (R2, R3), and a capacitor (C1). This switch is typically the series combination of two photo-Darlington circuits.

The state of GDSC is controlled essentially by the first voltage branch circuit (310A) which selectively adjusts the gate voltage. The first voltage branch circuit (310A) has high voltage capability but only a modest current supply capability. Thus, any current flowing through GDSC must be only of a modest value for the first branch circuit (310A) to be capable of switching GDSC from the ON to the OFF state.

The second branch circuit (310B) configuration is characterized in that it limits current flow therethrough to a maximum value. Once the maximum value is reached the second branch circuit (310B) automatically reduces the current flow therethrough to a significantly lower level. This reduces the current supply requirements of +V2 and thus helps lower costs and helps to insure that the potential level of +V2 stays at a level which is sufficient to maintain all the load switches (GDS1s) coupled thereto in the desired state.

The first and second branch circuits (310A and 310B) maintain the load switch(es) (GDS1) in a state such that conduction can occur through a load switch (GDS1) if the potentials of the anode and cathode thereof are sufficient to support conduction or it can inhibit conduction through the load switch by maintaining the control switch (GDSC) in an ON state. The third branch circuit (310C) serves to help interrupt conduction through a load switch (GDS1) independent of the anode and cathode potentials thereof so long as these supplied potentials are within preselected limits. Thus the third branch circuit (310C) helps to switch the load switch (GDS1) to an OFF state. The third branch circuit (310C) can be common to a great number of control circuits which each have a separate first and second branch circuit and a separate control switch (GDSC).

These and other features and advantages of the invention are better understood from a consideration of the following detailed description taken in conjunction with the accompanying drawing.

BRIEF DESCRIPTION OF THE DRAWING

FIG. 1 illustrates two interconnected solid-state structures on a common semiconductor body (substrate);

FIG. 2 illustrates two separate solid-state structures formed on the semiconductor body (substrate) of FIG. 1.

DETAILED DESCRIPTION

Figure 3:
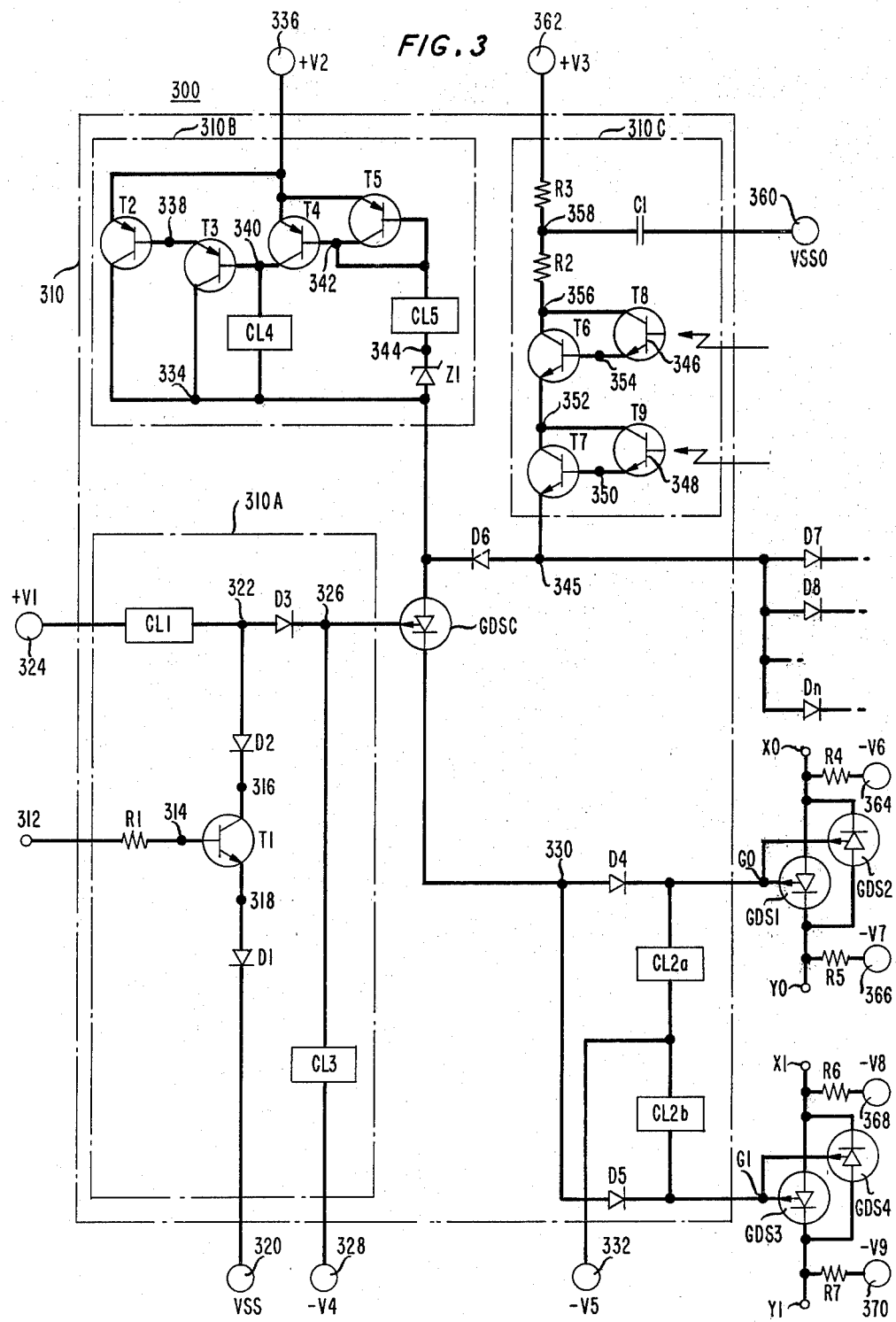
FIG. 3 illustrates a switching system in accordance with one embodiment of the present invention.

Referring now to FIG. 1, there is illustrated a semiconductor structure 10 comprising gated diode switches GDS1 (GDS3) and GDS2 (GDS4) which are illustrated within dashed line rectangles and are both formed on a common support member 12. This basic gated diode switch structure is disclosed and described in U.S. patent application Ser. No. 107,774 (A. R. Hartman et al.).

Support member 12 is typically a semiconductor wafer or a substrate. Dielectric layers 14 and 14a separate monocrystalline semiconductor bodies 16 and 16a, respectively, from support member 12 and from each other. Support member 12 has a major surface 11 and bodies 16 and 16a each have a portion that is common with surface 11. Whereas only two gated diode switches are illustrated, a plurality of dielectrically isolated gated diode switches of the type of GDS1 and/or GDS2 can be formed in a common semiconductor wafer or substrate 12.

GDS1 and GDS2 are illustrated having electrical connections therebetween which facilitate the use thereof as a bidirectional high voltage switch. GDS1 and GDS2 need not be electrically connected and each can function independently of the other.

In one typical embodiment, support member 12 is a semiconductor wafer (substrate) of n or p type conductivity and semiconductor bodies 16 and 16a have bulk portions thereof which are of p− type conductivity. The semiconductor regions contained within semiconductor body 16 are very similar to those contained in body 16a. A localized anode region 18, which is typically of p+ type conductivity, is included in body 16 and has a portion thereof that extends to surface 11. Surrounding anode region 18 is a p type region 42 which also has a portion thereof which extends to surface 11. Surrounding region 42 is a p− type region 43 which also has a portion thereof which extends to surface 11. The conductivity of region 42 is intermediate between that of anode region 18 and semiconductor body 16. The conductivity of region 43 is intermediate between that of region 42 and semiconductor body 16. Electrode 28 is illustrated making contact to region 18. Electrode 28 is separated from portions of surface 11 other than those over the exposed portion of region 18 by dielectric layer 26. A localized gate region 20 of n+ type conductivity is included in body 16 and has a portion thereof which extends to surface 11 and is separated from region 42 by portions of the bulk of semiconductor body 16. An electrode 30 contacts region 20 at surface 11. Electrode 30 is separated from portions of surface 11 other than those over the exposed portion of region 20 by dielectric layer 26. A localized cathode region 24, which is of n+ type conductivity, is included in body 16 and is separated from region 20 by portions of the bulk of semiconductor body 16. Region 24 is encircled by a p+ type guard ring 40 which, in turn, is encircled by a p type region 22 which, in turn, is encircled by a guard ring like p type region 46. Region 46 can extend, as is illustrated by the dashed line, to essentially completely surround region 22, except for the portions thereof common to surface 11. Region 46 is separated from regions 20 and 43 by portions of the bulk of semiconductor body 16. Electrode 32 contacts region 24. Electrode 32 is separated from portions of surface 11 other than over the respective exposed portion of region 24. A layer 48 of n type conductivity exists between the dielectric layer 14 and semiconductor body 16. Layer 48, which is part of a preferred embodiment, is shown in dashed line since it is optional. Gate region 20 also serves as the collector of a lateral n-p-n transistor with cathode region 24 serving as the emitter and regions 46, 22, and 40 serving as the base.

Semiconductor body 16a contains regions which are very similar to those contained within semiconductor body 16.

GDS1 is typically operated as a switch which is characterized by a low impedance between anode region 18 and cathode region 24 when in the ON (conducting) state and as a high impedance between said two regions when in the OFF (nonconducting) state. With operating potentials applied to anode region 18 and cathode region 24, the potential applied to gate region 20 determines the state of the switch. Conduction between anode region 18 and cathode region 24 can occur if the potential of the gate region 20 is near or below the potential of the anode region 18, cathode region 24, and region 22. During the ON state holes are injected into body 16 from anode region 18 and electrons are injected into body 16 from cathode region 24. This effectively lowers the resistance of body 16 such that the resistance between anode region 18 and cathode region 24 is relatively low when GDS1 is operating in the ON state. This type of operation is denoted as dual carrier injection and the type of structure described therein has been denoted as a gated diode switch (GDS). Guard ring region 40 and regions 22 and 46 help limit the punch-through of a depletion layer formed during operation between gate region 20 and cathode region 24 and help to inhibit the formation of a surface inversion layer between these two regions. In addition, they facilitate gate region 20 and cathode region 24 being relatively closely spaced apart. This facilitates relatively low resistance between anode region 18 and cathode region 22 during the ON state.

Substrate 12 is typically held at the most positive potential level available. Conduction between anode region 18 and cathode region 24 is inhibited or cut off if the potential of gate region 20 is sufficiently more positive than that of anode region 18 and cathode region 24. The amount of excess positive potential needed to inhibit or cut off conduction is a function of the geometry and impurity concentration (doping) levels of GDS1. This positive gate potential causes a portion of body 16 between gate region 20 and the portion of dielectric layer 14 therebelow to be at a potential that is more positive than that of anode region 18, cathode region 24, and region 22. This positive potential barrier inhibits the conduction of holes from anode region 18 to cathode region 24. It essentially pinches off body 16 against dielectric layer 14 in the bulk portion of semiconductor body 16 below gate region 20 and extending down to dielectric layer 14. It also serves to collect electrons emitted at cathode region 24 before they can reach anode region 18. Examples of control circuitry capable of supplying the needed gate potentials and absorbing the electrons are illustrated and described in copending U.S. patent applications Ser. Nos. 972,023 and 972,024, which were both filed on Dec. 20, 1978, and have a common assignee with the present application. Other control circuitry in accordance with the present invention for controlling gated diode switches like GDS1 (GDS3) and/or GDS2 (GDS4) is illustrated and described in FIG. 3 herein.

The electrical connections shown between electrodes 28 and 32a to a terminal X0 (X1), electrodes 30 and 30a to a terminal G0 (G1), and electrodes 32 and 28a to terminal Y0 (Y1), couple GDS1 (GDS3) and GDS2 (GDS4) together so as to form a bidirectional switching element whose equivalent circuit is illustrated in FIG. 3 herein.

One embodiment of structure 10 has been fabricated with 16 dielectrically separated switches on a single nominally undoped silicon support member (substrate) 12 which is 19 to 21 mils thick. Dielectric layer 14 is a silicon dioxide layer that is 3 to 4 microns thick. Body 16 is typically 44 to 54 microns thick, approximately 420 microns long, 300 microns wide, and is of p type conductivity with an impurity concentration in the range of approximately $5-9 \times 10^{13}$ impurities/cm$^3$. Layer 48, when it exists, is of n type conductivity with an impurity concentration in the range of $5 \times 10^{13}$ to $9 \times 10^{14}$ impurities/cm$^3$ and a thickness of approximately 12 microns. Anode region 18 is of p+ type conductivity and is typically 2 to 4 microns thick, 24 microns wide, 145 microns long, and has an impurity concentration of approximately $10^{19}$ impurities/cm$^3$. Region 42 is of p type conductivity, is typically 3-4 microns thick, 31 microns wide, 152 microns long, and has an impurity concentration of approximately $10^{18}$ impurities/cm$^3$. Region 43 is of p type conductivity, is typically 15 microns thick, 90 microns wide, 211 microns long, and has an impurity concentration of approximately $10^{16}$ impurities/cm$^3$. Electrode 28 is typically aluminum, with a thickness of 1½ microns, a width of 74 microns, and a length of 195 microns. Gate region 20 is of n+ type conductivity and is typically 15 microns thick, 40 microns wide, 300 microns long, and has an impurity concentration of approximately $5 \times 10^{19}$ impurities/cm$^3$. Region 36 is of p+ type conductivity and is typically 2 microns thick, 15 microns wide, 15 microns long, and has an impurity concentration of approximately $10^{19}$ impurities/cm$^3$. Electrode 30 is typically aluminum, 1½ microns thick, 50 microns wide, and 320 microns long. The spacing between adjacent edges of electrodes 28 and 30 and between 30 and 32 is 40 microns in both cases. Cathode region 24 is of n+ type conductivity and is typically 1½ microns thick, 33 microns wide, 99 microns long, and has an impurity concentration of approximately $5 \times 10^{19}$ impurities/cm$^3$. Guard ring region 40, which surrounds cathode region 24, is of p+ type conductivity and is 2 microns deep, has an inner diameter along surface 11 of approximately 45 microns and an outer diameter of approximately 71 microns, and an impurity concentration of approximately $10^{19}$ impurities/cm$^3$. The spacing between guard ring 40 and cathode region 24 is approximately 6 microns. Region 22 is of p type conductivity, 79 microns wide, 145 microns long, 3 to 4 microns thick, and has an impurity concentration of $10^{18}$ impurities/cm$^3$. Region 46 is of p type conductivity, is 130 microns wide at the outer periphery, approximately 9 microns wide at the inner periphery (the distance between the sidewalls of region 46 where they intersect region 22), 195 microns long at the outer periphery, 75 microns long at the inner periphery, 15 microns deep, and has an impurity concentration of $10^{16}$ impurities/cm$^3$. Electrode 32 is typically aluminum, with a thickness of 1½ microns, a width of 114 microns, and a length of 180 microns. Region 34 is of n+ type conductivity, is 15 microns wide, 15 microns long, 1½ microns deep, and has an impurity concentration of approximately $5 \times 10^{19}$ impurities/cm$^3$. Electrode 38 is typically aluminum, with a thickness of 1½ microns, a width of 15 microns, and a length of 30 microns. The distance between the edge of region 42 and the edge of semiconductor body 16 is typically 42 microns. The distance between the edge of region 46 and semiconductor body 16 is typically 49.5 microns.

Referring now to FIG. 2, there is illustrated another portion of semiconductor support member 12 comprising a gated diode switch GDSC and a pinch resistor CL1 (CL2a, CL2b, CL3, CL4, CL5) which are illustrated within separate dashed line rectangles. GDSC is essentially identical to GDS1 (GDS3) and GDS2 (GDS4) except it is not illustrated connected to another gated diode switch. CL1 (CL2a, CL2b, CL3, CL4, CL5) is separated from 12 by a dielectric layer 14cl and comprises a semiconductor body 16cl whose bulk is of p− type conductivity. A p+ type conductivity contact region 18cl and separated n+ type conductivity regions 20cl and 24cl exist within body 16cl. A p type conductivity region 42cl encircles region 18cl and is separated from region 20cl by a portion of the bulk of body 16cl. The conductivity of region 42cl is intermediate between that of region 18cl and body 16cl. A p+ type conductivity region 22cl encircles region 24cl and itself is encircled by a p type conductivity type region 46cl. Region 46cl is separated from region 20cl by a portion of the bulk of body 16cl. The conductivity of region 46cl is intermediate between that of region 22cl and body 16cl. An aluminum electrode 28cl makes ohmic contact to regions 18cl and 20cl. Another aluminum electrode 32cl makes ohmic contact to region 24cl. Apertured dielectric layer 26 isolates electrodes 28cl and 32cl from portions of surface 11 except where it is desired to make low resistance (ohmic) contact.

CL1 (CL2a, CL2b, CL3, CL4, CL5) acts essentially as a pinch resistor with region 20cl pinching off semiconductor body 16cl to create a relatively high resistance region between the bottom of region 20cl and the top of dielectric layer 14. CL1 (CL2a, CL2b, CL3, CL4, CL5) acts to limit current flow between regions 18cl and 24cl. Within a first range of potential difference between regions 18cl and 24cl, the resistance between the two regions is essentially constant and the current increases linearly with voltage. Once this range is exceeded, the electrical field created under electrode 28cl tends to effectively further pinch off the portion of semiconductor body 16cl under region 20cl. This increases the resistance between regions 18cl and 24cl and thus limits current flow from one region to the other as voltage across the regions increases. CL1 (CL2a, CL2b, CL3, CL4, CL5) thus acts as a resistor and as a current limiter.

The previously discussed fabricated embodiment of structure 10 also includes a plurality of current limiters like CL1 (CL2a, CL2b, CL3, CL4, CL5). Body 16cl, regions 18cl, 42cl, 20cl, 24cl, 22cl, 46cl, and layer 48cl had the same impurity concentrations as body 16, regions 18, 42, 20, 24, 22, 46, and layer 48 of FIG. 1, respectively. Dielectric layer 16cl is silicon dioxide as is layer 16 of FIG. 1. Electrodes 18cl and 32cl are of aluminum as are all electrodes of GDS1 (GDS3) of FIG. 1. The actual geometry of CL1 (CL2a, CL2b, CL3, CL4, CL5) is a function of the desired current limiting required.

Referring now to FIG. 3, there is illustrated a switching system 300 comprising control circuitry 310 (contained within the large dashed line rectangle) and two pairs of high voltage capability switches GDS1, GDS2 and GDS3, GDS4. Control circuitry 310 comprises a gated diode switch GDSC, a first branch circuit 310A (illustrated within a dashed line rectangle), a second branch circuit 310B (illustrated within a dashed line rectangle), a third branch circuit 310C (illustrated within a dashed line rectangle), diodes D4, D5, and D6, and current limiter circuits CL2a and CL2b.

A first output terminal G0 is coupled to the gates of GDS1 and GDS2, to the cathode of D4, and to a first terminal of CL2a. A second output terminal G1 is coupled to the gates of GDS3 and GDS4, to the cathode of D5, and to a first terminal of CL2b. The anode of GDS1 and the cathode of GDS2 are coupled to a first terminal X0 and to a resistor R4. R4 is also coupled to a power source −V6 and to a terminal 364. The cathode of GDS1 and the anode of GDS2 are coupled to a second terminal Y0 and to a resistor R5. R5 is also coupled to a power source −V7 and to a terminal 366. The anode of GDS3 and the cathode of GDS4 are coupled to a third terminal X1 and to a resistor R6. R6 is also coupled to a power source −V8 and to a terminal 368. The cathode of GDS3 and the anode of GDS4 are coupled to a fourth terminal Y1 and to a resistor R7. R7 is also coupled to a power source −V9 and to a terminal 370.

The combination of GDS1 and GDS2 functions as a first bidirectional switch which selectively couples terminals X0 and Y0 via a relatively low resistance path through GDS1 or GDS2. The combination of GDS3 and GDS4 serves as a second bidirectional switch which selectively couples terminals X1 and Y1 via a relatively low resistance path through GDS3 or GDS4. For illustrative purposes these switches are assumed to comprise the interconnected gated diode switches illustrated in FIG. 1. GDSC is assumed to be the portion of the structure of FIG. 2 illustrated within the dashed line rectangle denoted as GDSC. Control circuitry 310 uses six current limiter circuits CL1, CL2a, CL2b, CL3, CL4, and CL5. For illustrative purposes these current limiters are assumed to each be like the portion of the structure of FIG. 2 illustrated within the dashed line rectangle and denoted as CL1 (CL2a, CL2b, CL3, CL4, CL5).

Control circuitry 310 functions so as to supply the needed potentials at terminals G0 and G1 and the current sourcing capability necessary to control the state of GDS1, GDS2, GDS3, and GDS4.

An input terminal 312 is coupled to one terminal of a resistor R1 of branch circuit 310A. An output terminal 326 of 310A is coupled to the gate of GDSC, to the cathode of a p-n junction diode D3 of 310A, and to a first terminal of a current limiter circuit CL3 of 310A. 310A serves to control the state of GDSC by controlling the potential of the gate of GDSC and by having the capability of sourcing current (providing positive current flow) into the gate of GDSC. 310A comprises p-n junction diodes D1, D2, and D3, n-p-n transistor T1, current limiters CL1 and CL3, and a resistor R1. A second terminal of R1 is coupled to the base of T1 and to a terminal 314. The collector of T1 is coupled to the cathode of D2 and to a terminal 316. The emitter of T1 is coupled to the anode of D1 and to a terminal 318. The anodes of D2 and D3 and one terminal of CL1 are coupled to a terminal 322. A second terminal of CL1 is coupled to potential source +V1 and to a terminal 324. The cathode of D1 is coupled to potential source VSS and to a terminal 320. A second terminal of CL3 is coupled to a potential source −V4 and to a terminal 328. CL3 is optional.

Circuit branch 310B comprises p-n-p transistors T2, T3, T4, and T5, current limiter circuits CL4 and CL5 and a zener diode Z1. The collectors of T2 and T3, the anode of Z1, and a first terminal of CL4 are coupled to the anode of GDSC, the cathode of D6, and to a terminal 334. The emitters of T2, T4, and T5 are coupled to a potential source +V2 and to a terminal 336. The base of T2 is coupled to the emitter of T3 and to a terminal 338. The base of T3 is coupled to the collector of T4, a second terminal of CL4, and to a terminal 340. The base of T4 is coupled to the collector and base of T5, a second terminal of CL5, and to a terminal 342. A first terminal of CL5 is coupled to the cathode of Z1 and to a terminal 344.

310B serves to supply a relatively modest amount of current into the anode of GDSC and is designed to allow the current level therethrough to increase to a preselected maximum level and then to automatically reduce the current level therethrough to a lower level. 310B essentially functions as a first load element of GDSC which helps maintain the states of GDS1, GDS2, GDS3, and GDS4.

Circuit branch 310C comprises n-p-n transistors T6 and T7, n-p-n phototransistors T8 and T9, which have photosensitive base areas 346 and 348, respectively, resistors R2 and R3, and a capacitor C1. The emitter of T7 is coupled to a terminal 345 and to the anodes of D6, D7, D8, and Dn. Each of D7, D8 ... Dn is used with a separate control circuitry 310. The cathode of D6 is coupled to the anode of GDSC and to terminal 334. 310C is thus shared among a plurality of control circuitries 310 which each can control one or more gated diode switch pairs like GDS1 and GDS2. The base of T7 is coupled to the emitter of T9 and to a terminal 350. The collectors of T7 and T9 and the emitter of T6 are coupled to a terminal 352. The base of T6 is coupled to the emitter of T8 and to a terminal 354. The collectors of T6 and T8 and a first terminal of R2 are coupled to a terminal 356. A second terminal of R2, a first terminal of R3, and a first terminal of C1 are coupled to a terminal 358. A second terminal of C1 is coupled to a potential source VSS0 and to a terminal 360. A second terminal of R3 is coupled to a potential source +V3 and to a terminal 362. The combination of T6, T7, T8, and T9 acts as a single high voltage and relatively high current capability photoactivated switch.

310C functions as a second load element of GDSC and acts to provide a relatively large pulse of current into the anode (terminal 334) of GDSC which helps to switch GDS1, GDS2, GDS3, and/or GDS4 to the OFF state. R2 and R3 limit current flow from +V3 through D6, GDSC, D4, and/or D5, and into the gates of GDS1, GDS2, GDS3, and/or GDS4. R2 also limits current flow from C1. These limiting factors help insure against the burn out of GDSC, GDS1, GDS2, GDS3, and/or GDS4.

The cathode of GDSC is coupled to the anodes of D4 and D5 and to a terminal 330. Second terminals of CL2a and CL2b are coupled to a power source −V5 and to a terminal 332.

Terminal 330 can be directly connected to terminal G0 if GDS3 and GDS4 are not needed. In this case D4 and D5 are both eliminated. In another embodiment a second GDSC with its anode coupled to the anode of the first GDSC and its gate coupled to the gate of the first GDSC is used. In this embodiment D4 and D5 are eliminated and the cathode of the first GDSC is connected directly to G0 and the cathode of the second GDSC is connected directly to G1.

The basic operation of switching system 300 is as follows:

Assuming that the anodes of GDS1 and GDS3 and the cathodes of GDS2 and GDS4 are at +220 volts and the anodes of GDS2 and GDS4 and the cathodes of GDS1 and GDS3 are at −220 volts. Conduction between terminals X0 and Y0 and between terminals X1 and Y1 occurs if the potentials of terminals G0 and G1 are at +220 volts or less positive. Conduction can occur until the potentials of the gates of GDS1, GDS2, GDS3, and GDS4 reach a positive enough value to essentially completely pinch off the semiconductor body 16 of each GDS between the anode and cathode region thereof. For the GDSs illustrated in FIGS. 1 and 2, this potential is about 20 volts above the anode potential. In this case the pinch-off voltage is +240 volts.

With +V1=+337 volts, +V2=312 volts, +V3=312 volts, VSS=+260 volts, −V4=200 volts, −V5=200 volts, VSS0=0 volts, and current limiters CL1, CL2a, CL2b, CL3, CL4, and CL5 limiting current therethrough to 70, 6, 6, 6, 2, and 1 microamperes, respectively, C1=0.1 microfarad, resistors R1, R2, and R3=20k, 1k, and 100k ohms, respectively, and the breakdown voltage of Z1=35 volts, circuitry 310 is capable of providing the needed potentials and source of current to control the states of GDS1, GDS2, GDS3, and GDS4.

Branch circuit 310A serves to set the potential of terminal 326 (the gate of GDSC) so as to control the state of GDSC. A low level input voltage signal, a "0" (typically +260 volts), applied to input terminal 312 biases T1 off and facilitates a flow of current from +V1 through CL1, D3, CL3, and into −V4. CL1 and CL3 are selected such that the voltage appearing at terminal 326 with T1 biased off is at a level which is significantly more positive than the potential level of +V2 and/or +V3. CL3 is optional and can be eliminated. In such case, D3 conducts in the forward direction until terminal 326 reaches a potential level within several tenths of a volt of +V1. This potential on the gate of GDSC biases GDSC to the OFF state and thus isolates terminal 330 from +V2 and +V3. Terminal 330 floats in potential at a level no more positive than one p-n junction drop below the potential of terminal X0 or Y0, which is even more positive in potential. Terminal G0 assumes a potential level close to that of X0 as the gate-to-anode junction of GDS1 becomes forward-biased. Terminal G1 assumes a potential close to that of X1 as the anode-to-gate junction of GDS3 becomes forward-biased. These conditions bias GDS1 and GDS3 ON and conduction between terminals X0 and Y0 and between terminals X1 and Y1 occurs.

If GDSC has been in the ON (conduction) state prior to the application of the "0" input level to terminal 312, then positive current flows from +V1, through D1, and into the gate of GDSC. CL1 is selected to allow a greater current flow therethrough then through CL3 to insure that sufficient positive current is available to flow into the gate of GDSC so as to cut off conduction between the anode and cathode thereof. With GDSC on and conducting, GDS1, GDS2, GDS3, and GDS4 are normally in an OFF state. Only a relatively modest amount of positive current must flow into the gate of GDSC to cut off conduction therethrough since the conduction through GDSC is relatively small. It is thus not necessary to use a high current and high voltage device to provide the needed current sourcing function necessary to cause GDSC to assume the OFF state. 310A has only modest current sourcing capability and accordingly can only cause GDSC to switch off if the current flow through GDSC is relatively low. Branch circuit 310B serves to selectively maintain the current through GDSC at a level which is within a range that is low enough for 310A to switch GDSC off.

The potential of terminal 312 is raised to a high level, a "1" (typically +265 volts), to cause GDSC to switch to the ON state and thus cause GDS1, GDS2, GDS3, and GDS4 to switch to the OFF (blocking) state. A "1" input applied to terminal 312 biases T1 ON and allows T1 to operate in saturation. The potential of terminal 322 is pulled down to approximately +258.7 volts (assuming a VCE(SAT) of 0.3 volts for T1 and voltage drops across D1 and D2 of 0.7 volts each). Without CL3 present, terminal 326 is pulled to a value close to that of +V2 or +V3 or to a more negative potential because of leakage through D3. The potential of terminal 326 cannot drop below one diode voltage drop below the potential of the anode of GDSC because a junction diode comprising the anode and gate of GDSC becomes forward-biased and pulls up the potential of terminal 326. With CL3 present, terminal 326 is rapidly and actively held at a value close to one diode drop below the potential of the anode of GDSC. In either case, this switches GDSC to the ON state and causes the potential of terminal 330 to be approximately 2 volts less than the potential of the anode of GDSC (terminal 334). The voltage drops from terminal 338 to 334 and from terminal 362 to 334 are selected such that with GDSC ON, the potential of terminal 330 is more positive than that of the anode of GDS1, GDS2, GDS3, or GDS4 by a sufficient amount to switch all these GDSs to the OFF (blocking) state. In addition, there is a sufficient positive current flow from 310B and 310C through GDSC and into the gates of these GDSs (GDS1, GDS2, GDS3, GDS4) to switch any of these ON GDSs to the OFF state. Once any of these GDSs is switched off the current flow into the gate thereof ceases. The geometry and impurity concentrations of these GDSs determine exactly how much more of a positive potential must exist at the gate relative to the anode and cathode to turn it off.

Minority carriers emitted at the cathode of one of these GDSs (GDS1, GDS2, GDS3, GDS4) and collected by the gate constitute the equivalent of positive current flow from +V3 through R3, R2, T6, T7, and/or C1, R2, T6, T8, T7, T9, and/or from +V2 through T2 and T3, T4, CL4, T5, CL5, and Z1 and GDSC into the gate of GDS1, GDS2, GDS3, and/or GDS4. This current flow can be substantial and as a result it is necessary to have a high voltage and current device such as GDSC to switch these GDSs to the OFF state. The high cost of a high voltage and high current transistor limits its application in this control circuit. The operation of 310B and 310C will be explained in detail below.

Circuit branch 310B operates as follows:

Assuming GDSC is biased ON, current flows from +V2 through the emitter-collector circuits of T2 and T3, the emitter-base of T3 and CL4, and into the anode of GDSC (terminal 334). If this current flow through T2 is within preselected limits the voltage difference between terminals 336 and 334 is relatively small and below the breakdown voltage of Z1. If for some reason GDSC starts to require substantially more current, as might be the case if GDS1, GDS2, GDS3, and/or GDS4 failed to break current and continue ON and conducting, the current flow through T2 increases and the potential of terminal 334 drops such that the potential difference between terminals 334 and 336 is sufficient to cause Z1 to break down and conduct from cathode to anode. This causes current to flow through T5, CL5, and Z1 which biases T4 ON and causes an additional current path to be established from +V2 through T4 and CL4. This lowers the potential difference between terminals 336 and 340 to a level at which T2 and T3 become biased OFF. This is because the ON collector-emitter voltage of T4 is selected to be below the ON emitter-base voltages of T2 and T3. This substantially reduces the current flow through 310B to the limits set by CL4 and CL5. Thus 310B serves to allow conduction therethrough to increase to a preselected maximum level and then substantially reduces the current flow therethrough. This allows the power source +V2 to be a less expensive component than would be the case if it had to constantly supply a large amount of current flow into GDSC. In addition, it facilitates the switching of GDSC to the OFF state since circuit branch 310A has only modest current sourcing capabilities. The potential level +V2 thus is maintained within preselected levels.

Typically several circuits like 310 have a common potential source +V2. It is desirable that these other circuits 310 have the +V2 potential source stay within preselected potential limits such that the load switching devices coupled to these other circuits 310 are maintained in their proper states even if some of the load switching devices fail to be switched OFF and break current flow therethrough. Branch circuit 310B is designed to help keep the steady-state drain on +V2 at a value less than a preselected level. Accordingly, it helps in limiting possible variations in the potential level of +V2.

Control circuitry 300, using two separate GDSCs and excluding CL3, D4, and D5, has been built and found to be functional. The cathode of the first GDSC was connected directly to G0 and to CL2a. The cathode of the second GDSC was connected directly to G1 and to CL2b. Four voltage branch circuits 310A and one shared branch circuit 310B were used to control the states of eight pairs of gated diode switches. Each of the pairs of gated diode switches were similar to the pair of interconnected GDSs of FIG. 1. GDSC and all the current limiters are similar to the GDSs and CLs, respectively, of FIG. 2. Four switching systems 300, excluding 310C and R4, R5, R6, and R7, were fabricated on a single integrated circuit chip having an area of 13.7 square millimeters using dielectric isolation of components. One 310C branch circuit was used with several of the fabricated integrated circuits. The structure of the junction transistors used were similar to those disclosed in copending U.S. patent application Ser. No. 971,632, which was filed on Dec. 20, 1978, and in which there is a common assignee with the present application. The average turn-on time of a gated diode switch used with 300 is 1000 microseconds. The turn-off time is 2000 microseconds. The average power dissipation of branch circuits 310A and 310B is 8 milliwatts.

In many telephone switching applications GDS1, GDS2, GDS3, and GDS4 operate with only 48 volts between anode and cathode when in the OFF state; however, it is possible that ±220 volts exists at the anode and/or cathode due to ringing, testing, coin telephone controlling, and induced 60 Hz voltages and, accordingly, control circuit 310 is designed to block these high voltages.

U.S. patent application Ser. No. 120,282 (A. R. Hartman-P. W. Shackle), which was filed on Feb. 11, 1980, and has one common inventor with the present application and a common assignee, discloses control circuitry which produces a single current pulse or a current pulse train to switch OFF a gated diode switch. The present application has priority over Ser. No. 120,282.

The embodiments described herein are intended to be illustrative of the general principles of the present invention. Various modifications are possible consistent with the spirit of the invention. Still further, other high voltage and high current switches, such as a gated diode switch, could be substituted for the photo-Darlington pairs provided appropriate control circuitry is provided to control same. Still further, the junction transistors could be replaced by field-effect transistors provided the polarities and magnitudes of the power supplies and circuit configurations are appropriately modified as is well known in the art. Still further, R1, R2, R3, R4, R5, R6, and R7 can be standard integrated circuit resistors or pinch resistors. Still further, the current limiters can be a variety of different types of resistors or junction field-effect transistors. Still further, the branch circuit 310A can be replaced by a variety of circuits including the circuitry within dashed line rectangle B illustrated in FIG. 3 of U.S. patent application Ser. No. 972,023, filed Dec. 20, 1978. Still further, D1 and R1 can be switched in position such that the anode of D1 is coupled to 312 and one terminal of R1 is coupled to 318. Still further, a current limiter can be substituted for D3. CL3, which is optional, would not be used in this case.

We claim:

1. Circuitry for use with a first switching device of the type comprising a semiconductor body a bulk portion of which is of relatively high resistivity, a first region of a first conductivity type, a second region of a second conductivity type opposite that of the first conductivity type, the first and second regions being connected to output terminals of the switching device, a gate region of the second conductivity type, the gate region being coupled to a control terminal of the switching device, the first, second and gate regions being of relatively low resistivity and being mutually separated by portions of the bulk of the semiconductor body, the parameters of the device being such that, with a first voltage applied to the control terminal of the first switching device, a potential is established within a cross-sectional portion of the bulk of the semiconductor body which is substantially different from that of the potential of the first and second regions and which prevents current flow between the first and second regions, and that, with a second voltage applied to the control terminal of the first switching device and with appropriate voltages applied to the output terminals of the first switching device, a relatively low resistance current path is established between the first and second regions by dual carrier injection, a second switching device of the same type as said first switching device, a second output terminal of the second switching device being coupled to the control terminal of the first switching device, a first branch circuit being adapted to be coupled to a first potential source and being coupled to the second switching device for controlling conduction between the first and second regions thereof, comprising:

a second branch circuit coupled to the second switching device and being adapted to be coupled to a second potential source which has a lower potential than the first potential source;

the second branch circuit being adapted to supply up to a preselected maximum current level to the second switching device and then thereafter to reduce the current level to a lower level;

a third branch circuit coupled to the second switching device and being adapted to be coupled to a third potential source and further being adapted to supply a pulse of current to the second switching device;

the second circuit branch comprises a third switching device which has one output terminal coupled to the second switching device, a second output terminal adapted to be coupled to the second potential source, and which has a control terminal;

voltage sensitive circuit means coupled to the first and second output terminals and control terminal of the third switching device for sensing voltage across the output terminals of the third switching device and for biasing off said device if the potential across the output terminals thereof exceeds a preselected value; and the voltage sensitive circuit means comprises a zener diode, and fourth and fifth switching devices.

2. The circuitry of claim 1 further comprising:

first and second current limiter circuits;

the first current limiter circuit is coupled to first output terminals of the third and fourth switches;

the second current limiter circuit is coupled to the cathode of the zener diode and to a control terminal and first output terminal of the fifth switching device;

the anode of the zener diode and one terminal of the first current limiter are both coupled to the second switching device;

the second output terminals of the fourth and fifth switching devices are coupled to the second output terminal of the third switching device and are adapted to be coupled to the second potential source; and the third switching device comprises the combination of two switching devices with a control terminal of the first coupled to a second output terminal of the second and the first output terminals of both devices being coupled to the anode of the zener diode.

3. The circuitry of claim 2 further comprising:

the third branch circuit comprising a sixth switching device having output circuitry coupled to the second switching device and having a control portion, and the sixth switching device being adapted to selectively electrically isolate the second switching device from the third potential source;

a capacitor;

first and second resistors;

the first resistor being coupled to an output terminal of the sixth switching device and to a first terminal of the second resistor and to the capacitor; and a second terminal of the second resistor (R3) being adapted to be coupled to the third potential source.

* * * * *